United States Patent
Best et al.

(10) Patent No.: US 10,192,610 B2
(45) Date of Patent: Jan. 29, 2019

(54) METHODS AND APPARATUS FOR SYNCHRONIZING COMMUNICATION WITH A MEMORY CONTROLLER

(71) Applicant: Rambus Inc., Sunnyvale, CA (US)

(72) Inventors: Scott C. Best, Palo Alto, CA (US); Richard E. Warmke, Truckee, CA (US); David B. Roberts, San Jose, CA (US); Frank Lambrecht, Danville, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/667,706

(22) Filed: Aug. 3, 2017

(65) Prior Publication Data

US 2018/0047437 A1    Feb. 15, 2018

Related U.S. Application Data

(63) Continuation of application No. 15/259,854, filed on Sep. 8, 2016, now Pat. No. 9,741,423, which is a
(Continued)

(51) Int. Cl.
*G11C 11/4076* (2006.01)
*G06F 1/10* (2006.01)
(Continued)

(52) U.S. Cl.
CPC ............ *G11C 11/4076* (2013.01); *G06F 1/10* (2013.01); *G11C 7/10* (2013.01); *G11C 7/1087* (2013.01);
(Continued)

(58) Field of Classification Search
CPC . G11C 11/4076; G11C 11/4091; G11C 7/222; G11C 7/10; G11C 7/1087;
(Continued)

(56) References Cited

U.S. PATENT DOCUMENTS

| | | | |
|---|---|---|---|
| 4,663,735 | A | 5/1987 | Novak et al. |
| 5,056,118 | A | 10/1991 | Sun |

(Continued)

FOREIGN PATENT DOCUMENTS

| | | |
|---|---|---|
| JP | 2001-306176 | 2/2001 |
| WO | WO 98/37656 | 8/1998 |

OTHER PUBLICATIONS

Collins, Hansel, "DDR-SDRAM, High-Speed, Source Synchronous Interfaces Create Design Challenges," Sep. 2, 1999, Cahners EDN Access, printed Feb. 11, 2001. 15 pages.
(Continued)

*Primary Examiner* — Dac Ha
(74) *Attorney, Agent, or Firm* — Silicon Edge Law Group LLP; Arthur J. Behiel

(57) ABSTRACT

A memory controller receives data and phase-providing signals from a memory device. The phase-providing signal is not a clock signal, but is used by the memory controller to phase align a local data-sampling signal with the incoming data. The memory controller samples the data signal with the data-sampling signal. The memory controller can perform maintenance operations to update the phase relationship between the phase-providing and data-sampling signals.

19 Claims, 6 Drawing Sheets

Related U.S. Application Data continuation of application No. 14/849,425, filed on Sep. 9, 2015, now Pat. No. 9,466,353, which is a continuation of application No. 14/182,389, filed on Feb. 18, 2014, now Pat. No. 9,159,388, which is a continuation of application No. 13/687,391, filed on Nov. 28, 2012, now Pat. No. 8,666,007, which is a continuation of application No. 13/413,087, filed on Mar. 6, 2012, now Pat. No. 8,355,480, which is a continuation of application No. 13/169,901, filed on Jun. 27, 2011, now Pat. No. 8,208,595, which is a continuation of application No. 12/628,547, filed on Dec. 1, 2009, now Pat. No. 7,970,089, which is a continuation of application No. 12/079,388, filed on Mar. 25, 2008, now Pat. No. 7,627,066, which is a continuation of application No. 10/852,864, filed on May 24, 2004, now Pat. No. 7,349,510, which is a continuation of application No. 10/353,608, filed on Jan. 28, 2003, now Pat. No. 6,836,503, which is a continuation of application No. 09/891,184, filed on Jun. 25, 2001, now Pat. No. 6,570,944.

(51) Int. Cl.
| | |
|---|---|
| G11C 7/10 | (2006.01) |
| G11C 7/22 | (2006.01) |
| H03L 7/07 | (2006.01) |
| H03L 7/081 | (2006.01) |
| H04L 7/033 | (2006.01) |
| G11C 11/4091 | (2006.01) |
| G11C 7/04 | (2006.01) |

(52) U.S. Cl.
CPC .......... *G11C 7/222* (2013.01); *G11C 11/4091* (2013.01); *H03L 7/07* (2013.01); *H03L 7/0814* (2013.01); *H04L 7/0337* (2013.01); *G11C 7/04* (2013.01); *G11C 2207/107* (2013.01)

(58) Field of Classification Search
CPC ... G11C 7/04; G11C 2207/107; H04L 7/0337; H03L 7/0814; H03L 7/07; G06F 1/10
See application file for complete search history.

(56) References Cited

U.S. PATENT DOCUMENTS

| | | | |
|---|---|---|---|
| 5,097,489 A | 3/1992 | Tucci | |
| 5,305,245 A | 4/1994 | Kurihara | |
| 5,367,542 A | 11/1994 | Guo | |
| 5,400,370 A | 3/1995 | Guo | |
| 5,485,490 A | 1/1996 | Leung et al. | |
| 5,642,386 A | 6/1997 | Rocco, Jr. | |
| 5,646,968 A | 7/1997 | Kovacs | |
| 5,790,607 A | 8/1998 | Burke et al. | |
| 5,838,749 A | 11/1998 | Casper | |
| 5,844,436 A | 12/1998 | Altmann | |
| 5,850,422 A | 12/1998 | Chen | |
| 5,870,446 A * | 2/1999 | McMahan | H03L 7/00 370/516 |
| 5,870,549 A | 2/1999 | Bobo, II | |
| 5,870,594 A | 2/1999 | Doi et al. | |
| 5,910,740 A | 6/1999 | Underwood | |
| 5,948,083 A | 9/1999 | Gervasi | |
| 5,977,821 A | 11/1999 | Shibata | |
| 5,990,968 A | 11/1999 | Naka | |
| 6,085,345 A | 7/2000 | Taylor | |
| 6,100,733 A | 8/2000 | Dortu | |
| 6,111,446 A | 8/2000 | Keeth | |
| 6,114,879 A | 9/2000 | Popplewell et al. | |
| 6,125,157 A | 9/2000 | Donnelly et al. | |
| 6,166,572 A | 12/2000 | Yamaoka | |
| 6,172,937 B1 | 1/2001 | Ilkbahar | |
| 6,178,212 B1 | 1/2001 | Akashi | |
| 6,201,423 B1 | 3/2001 | Taguchi | |
| 6,279,090 B1 * | 8/2001 | Manning | G11C 7/22 711/105 |
| 6,330,650 B1 | 12/2001 | Toda et al. | |
| 6,396,888 B1 | 5/2002 | Notani | |
| 6,442,644 B1 | 8/2002 | Gustavson et al. | |
| 6,444,644 B1 | 9/2002 | Bruckdorfe | |
| 6,470,405 B2 | 10/2002 | Hampel et al. | |
| 6,542,976 B2 | 4/2003 | Hampel et al. | |
| 6,570,944 B2 | 5/2003 | Best et al. | |
| 6,591,353 B1 | 7/2003 | Ware et al. | |
| 6,678,811 B2 | 1/2004 | Rentschler et al. | |
| 6,701,140 B1 | 3/2004 | Stine | |
| 6,775,345 B1 | 8/2004 | Song | |
| 6,836,503 B2 | 12/2004 | Best et al. | |
| 6,967,992 B1 | 11/2005 | Rabaeijs et al. | |
| 6,978,328 B1 | 12/2005 | Osaka et al. | |
| 6,990,122 B2 | 1/2006 | Guinea et al. | |
| 7,016,259 B2 | 3/2006 | Jakobs | |
| 7,349,269 B2 | 3/2008 | Schaefer | |
| 7,349,510 B2 | 3/2008 | Best et al. | |
| 7,379,382 B2 | 5/2008 | LaBerge | |
| 7,627,066 B2 | 12/2009 | Best et al. | |
| 7,668,679 B2 | 2/2010 | Best | |
| 7,969,815 B2 | 6/2011 | LaBerge | |
| 8,355,480 B2 | 1/2013 | Best et al. | |
| 2001/0038106 A1 | 11/2001 | Coteus et al. | |
| 2001/0047450 A1 | 11/2001 | Gillingham et al. | |
| 2002/0034119 A1 | 3/2002 | Lee et al. | |
| 2002/0176315 A1 | 11/2002 | Graaff | |
| 2006/0114742 A1 | 6/2006 | Salmon et al. | |
| 2006/0262613 A1 | 11/2006 | Braun et al. | |
| 2010/0118627 A1 | 5/2010 | Best | |

OTHER PUBLICATIONS

EP Extended Search Report dated Jun. 29, 2010 re EP Application No. 10156597.6. 7 pages.

EP Office Action dated Feb. 7, 2011 re EP Application No. 10183217.8 includes Documents 1, 2, & 3. 89 pages.

EP Response dated Jan. 26, 2011 to the Official communication dated Aug. 2, 2010 for EP Application No. 10156597.6 re Request for Examination. 24 pages.

Gillingham et al., "SLDRAM: High Performance Open-Standard Memory," IEEE Micro, Nov./Dec. 1997, pp. 29-39, vol. 17, No. 6, Institute of Electrical and Electronics Engineers, Inc., Los Alamitos, California. 11 pages.

International Preliminary Report on Patentability dated Jul. 31, 2009 re International Application No. PCT/US2008/005135. 12 pages.

International Search Report, PCT/US2008/005135, dated Jan. 12, 2009. 12 pages.

JEDEC, "Double Data Rate (DDR) SDRAM Specification," JEDEC Standard JESD79, Jun. 2000, JEDEC Solid State Technology Association. 76 pages.

MicroNews, "A 1.6-GBps 1Gb Double Data Rate Synchronous DRAM," Third Quarter 1999, vol. 5, No. 3, printed Feb. 24, 2001. 10 pages.

Muljono et al., "High Speed, High Bandwidth External Cache Bus with A Center-Tapped-Termination Scheme," Intel Corporation, pp. 1-7, presented at A Symposium on High Performance Interconnects at Stanford University, Aug. 16-18, 2000. 7 pages.

Nakase et al., "Source-Synchronization and Timing Vernier Techniques for 1.2 GB/s SLDRAM Interface," IEEE Journal of Solid-State Circuits, vol. 34, No. 4, Apr. 1999, pp. 494-501. 8 pages.

Paris et al., "WP 24.3: A 800 MB/s 72 Mb SLDRAM with Digitally-Calibrated DLL," ISSCC, 0-7803-5129-0/99, Slide Supplement, IEEE, 1999, 10 pages.

Park et al., "SP 22.5:A 833Mb/s 2.5V 4Mb Double Data Rate SRAM," IEEE, pp. 22.5-1 to 22.5-9, copyright 1998. 18 pages.

PCT Notification of transmittal of the International Preliminary Report on Patentability, dated Jul. 31, 2009 re PCT/US2008/005135 filed on Apr. 18, 2008. 12 Pages.

(56) References Cited

OTHER PUBLICATIONS

Ryan, Kevin, "DDR SDRAM Fuctionality and Controller Read Data Capture," Micron Technology, Inc., DesignLine, 1999, pp. 1-24, vol. 8, Issue 3. 24 pages.

Takase et al., 1999 ISSCC Slide Supplement article entitled "Outline," copyright IEEE, pp. 348-349 and 506-507. 4 pages.

* cited by examiner

METHODS AND APPARATUS FOR SYNCHRONIZING COMMUNICATION WITH A MEMORY CONTROLLER

TECHNICAL FIELD

The present invention relates to the field of signal communications and more particularly to high-speed transfer of information within and between integrated circuit devices using electrical signaling.

BACKGROUND

In modern electronic systems, data and control information are transferred between various subsystems using extremely short-lived electrical signals. For example, in high-speed memory systems, a data signal from a memory controller to a memory device may be valid at the input of the memory device for only a nanosecond or less; less time, in some cases, than the propagation time of the data signal on the signaling path between the memory controller and the memory device. In any such high-speed signaling system, the ability of the receiving device to sample the data signal at a precise instant within the valid data interval (the "data eye") is often a critical factor in determining how brief the data eye may be and, consequently, the overall data transfer rate of the system. Accordingly, any technique for more accurately controlling the sampling instant within the data eye generally permits faster data transfer and therefore higher signaling bandwidth.

FIG. 1 illustrates a prior art high-speed signaling system in which a strobe signal is transmitted on strobe line DQS to control the sampling of data signals transmitted on data lines, DQ0-DQN. Because the strobe signal is edge-aligned with the data signals when transmitted (i.e., the strobe signal transition coincides with the opening of the data eye) and the DQS line introduces nominally the same propagation delay as the DQ0-DQn lines, the strobe signal and data signals arrive at the receiving device at nearly the same time. A variable delay circuit 15 then delays the strobe signal by half the nominal duration of the data eye so that the delayed strobe signal transitions at the midpoint of the data eye.

In order to prevent the delayed strobe signal from drifting away from the midpoint of the data eye (e.g., due to changes in voltage and temperature), a delay-locked loop circuit (DLL) 12 is provided to adjust the delay applied by the variable delay circuit over time. A variable delay circuit 21 within the DLL is formed by coarse and fine delay elements that correspond to coarse and fine delay elements within the variable delay circuit 15 in the strobe signal path. As the output of the variable delay circuit 21 within the DLL drifts out of phase with a reference clock signal (e.g., due to changes in voltage and temperature), the phase difference is detected by a phase detector 18 which outputs a signal to a delay control circuit 20 to adjust the delay control value applied to the variable delay circuit 21. The adjustment to the delay control value results in adjustment in the number of coarse and/or fine delay elements in the signal path of the variable delay circuit 21 so as to drive the output of the variable delay circuit 21 back toward phase lock with the reference clock signal. As shown in FIG. 1, the delay control value is also provided, after translation in a ratio circuit 22 according to the ratio between the reference clock period and one half the data eye duration, to the variable delay circuit 15 in the strobe signal path. By this arrangement, the delay applied to the data strobe signal is automatically adjusted to compensate for variations in voltage and temperature. Other relatively constant sources of error (e.g., process variations, mismatches in the DQS and DQ paths, etc.) may be compensated by the initial selection of coarse and fine delay elements within the variable delay circuit 21.

Unfortunately, because a delayed version of the data strobe signal is ultimately used to control the sampling of the DQ lines (a technique referred to herein as direct strobing), any transient sources of timing error in the data strobe signal such as intersymbol interference (ISI) and cross-talk, or data-dependent timing errors resulting from mismatched rising and falling edge rates are not significantly compensated by the variable delay circuit 15 and instead appear as timing jitter at the sample control inputs of the data receiver. This phenomenon is illustrated in FIG. 2. As shown, a strobe signal 31 is delayed by an amount of time, $T_{EYE}/2$, to produce a delayed strobe signal 33 that transitions at the midpoint of the data eye. Slightly advanced and delayed versions of the strobe signal 31 resulting from transient sources of timing error are illustrated by dashed lines 34 and 35, respectively. Because the transient sources of timing error are passed through to the output of the variable delay circuit 15 of FIG. 1, the delayed strobe signal 33 is likewise advanced or delayed, resulting in a sampling point that is offset from the ideal sampling point as shown. As discussed above, such inaccuracy in the sampling point translates to lost timing margin and ultimately to reduced data transfer rates.

SUMMARY

In accordance with an aspect of the present invention, an apparatus is disclosed that can reduce sampling errors for data communicated between devices. The apparatus uses phase information acquired from a timing reference signal such as a strobe signal to align a data-sampling signal for sampling a data signal that was sent along with the timing reference signal. The data-sampling signal may be provided by adjustably delaying a clock signal according to the phase information acquired from the strobe signal. The data-sampling signal may also have an improved waveform compared to the timing reference signal, including a fifty-percent duty cycle and sharp transitions. The phase information acquired from the timing reference signal may also be used for other purposes, such as aligning received data with a local clock domain, or transmitting data so that it arrives at a remote device in synchronism with a reference clock signal at the remote device.

DETAILED DESCRIPTION OF THE PREFERRED EMBODIMENTS

Figures 1, 2:
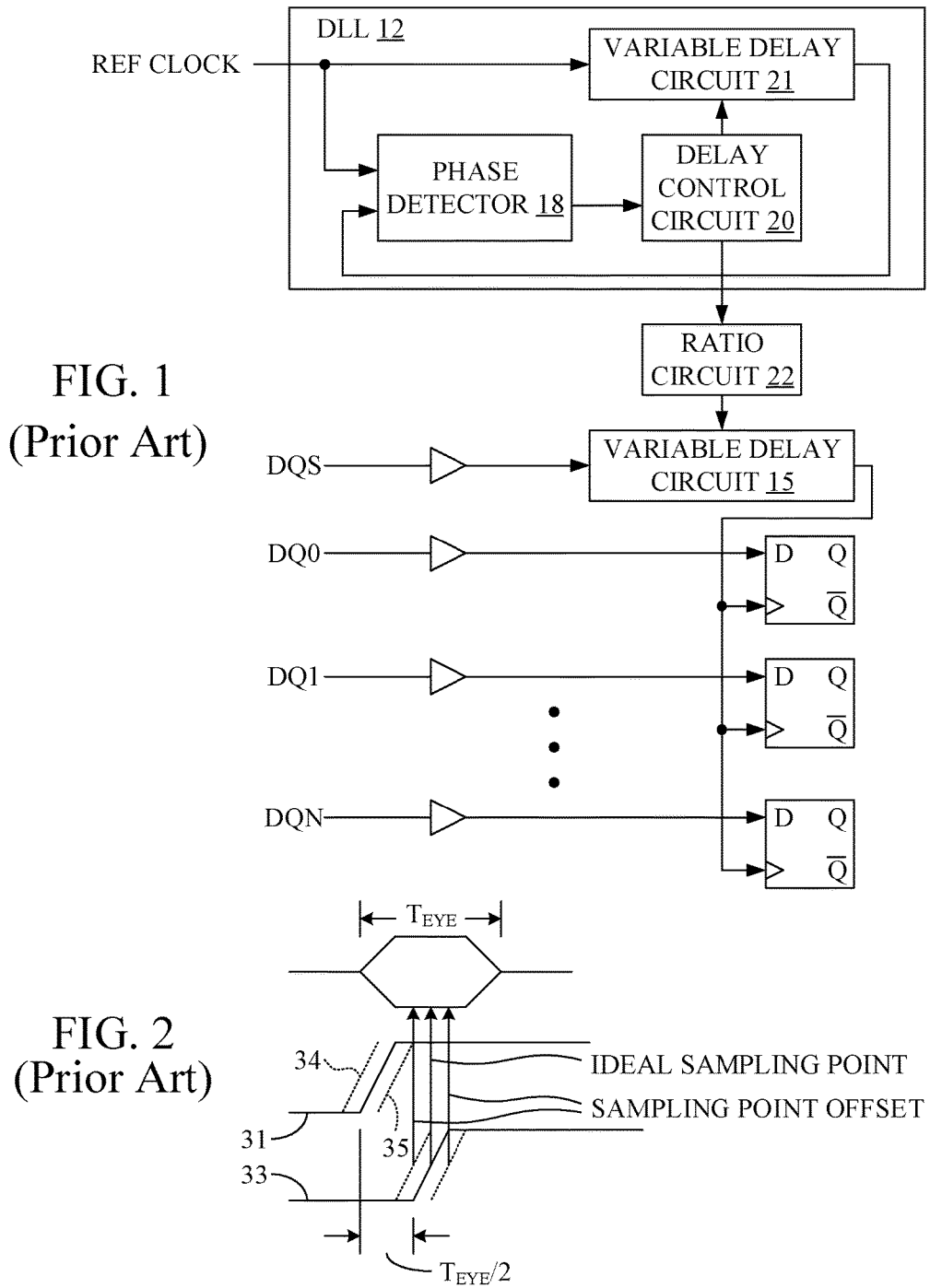
FIG. 1 is a diagram of a prior art signaling system that samples data signals with a strobe signal that is phase-adjusted with a delay-locked loop circuit.
FIG. 2 is a diagram of the phase-adjusted strobe signals of FIG. 1 used to sample data during a valid data interval represented by a data eye.
Figure 3:
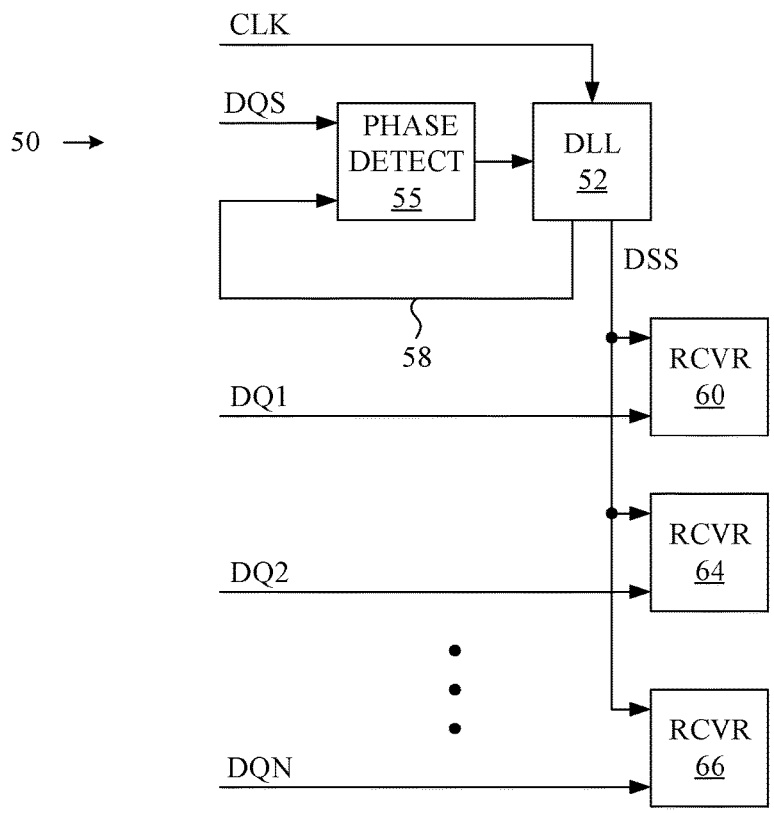
FIG. 3 is a diagram of an apparatus that samples data signals with a data-sampling signal that is generated by adjustably delaying a clock signal in accordance with phase information acquired from a strobe signal.

FIG. 3 shows a diagram of a data-sampling apparatus 50 that creates a data-sampling signal on data-sampling line DSS for sampling data signals received on data lines DQ1-DQN with receivers 60, 64 and 66. The data-sampling signal is output by a DLL 52 that adjusts the phase of a clock signal on clock line CLK in accordance with phase information acquired from a strobe signal received on strobe line DQS. The phase information is acquired by comparing, at a phase detector 55, the strobe signal received on strobe line DQS with the signal output by DLL 52 on phase-lock line 58. Thus, unlike the direct strobing of the prior art, in which the strobe signal is used for sampling data signals, in accordance with the present invention the strobe signal is used to adjust the phase of a data-sampling signal, and the data-sampling signal is instead employed to sample data signals.

As discussed below, embodiments of the present invention may be used with timing reference signals other than strobe signals, including without limitation, clock signals, and pseudo-random signals. Herein, the expression "strobe signal" refers to a signal that transitions between valid logic levels (e.g., logic high and logic low) when a valid signal is present on a corresponding data, control or address line. Except for calibration transitions and other overhead signaling associated with establishing or maintaining the timing accuracy of the strobe signal, the strobe signal is generally idle (often in a precharged state midway between valid logic levels) when no valid signal is present or is being output on the corresponding data, control or address line. By contrast, a clock signal transitions between logic levels in a periodic fashion regardless of whether control, data or address signals are present on other lines. Note that, in the case of a strobe signal that is precharged to a state midway between valid logic levels when idle, a transition from the precharged level to a valid logic level (sometimes called a preamble) typically precedes any transition between valid logic levels.

The strobe signal has been sent along with the data signals by a device that is transmitting data, not shown in this figure, whereas the clock signal is generally available to all devices in a data signaling system during system operation. In one embodiment, the strobe signal is in phase with the data signals when transmitted from the remote device. In this case, the DLL 52 is configured to output a data-sampling signal on line DSS that is 90° out of phase with the strobe signal received on line DQS, for sampling the received data signals with transitions of the data-sampling signal at the midpoint of the data eyes. In another embodiment, the strobe signal is 90° out of phase with the data signals when transmitted from the remote device. In this case, the DLL 52 is configured to output a data-sampling signal on line DSS that is in phase with the strobe signal received on line DQS, for sampling the received data signals with transitions of the data-sampling signal at the midpoint of the data eyes.

For a memory system implementation in which data and accompanying strobe signals are transmitted between a memory controller and one or more DRAM devices, a data-sampling apparatus such as apparatus 50 may be disposed only on the memory controller to keep the DRAM cost effective. In this case, the strobe signal is phase aligned with data signals transmitted by the DRAM, so the data-sampling signal output by DLL 52 is 90° out of phase with the data signals received on lines DQ1-DQN.

The strobe signal and data signals may be transmitted by similar output drivers, such as CMOS transistors, and over similar paths, such as conductive traces having substantially matched transmission characteristics. For certain implementations, both the strobe signal and the data signals may have different slopes for rising transitions versus falling transitions, for example due to inherent differences between PMOS and NMOS output driver transistors that may be used to drive the strobe signal and data signals high and low. This can cause the percentage of time that the strobe signal is high versus low to vary from an ideal 50% duty cycle.

Since the data signals have differences in rising and falling transitions that match those of the strobe signal, one might expect that imperfections in the strobe signal would cancel those in the data signals. However, a rising strobe signal transition may correspond to a rising or a falling data signal transition, and a falling strobe signal transition may correspond to a rising or falling data signal transition. Thus, although strobe signal imperfections may be cancelled by certain data signal imperfections, they may be magnified by other data signal imperfections. Other imperfections that can degrade the strobe signal include intersymbol interference, cross talk and signal dispersion.

In contrast, the data-sampling signal output on line DSS may be created with a desired waveform, for example having a fifty percent duty cycle and sharp transitions, compared to the strobe signal. The DLL 52 may also smooth jitter of the strobe signal so that in addition to providing an improved waveform, the data-sampling signal DSS has a more stable phase than the strobe signal DQS. Thus, instead of the direct strobing of the prior art, which is subject to imperfections of the strobe signal DQS, a high quality data-sampling signal DSS is used to sample data.

Figure 4:
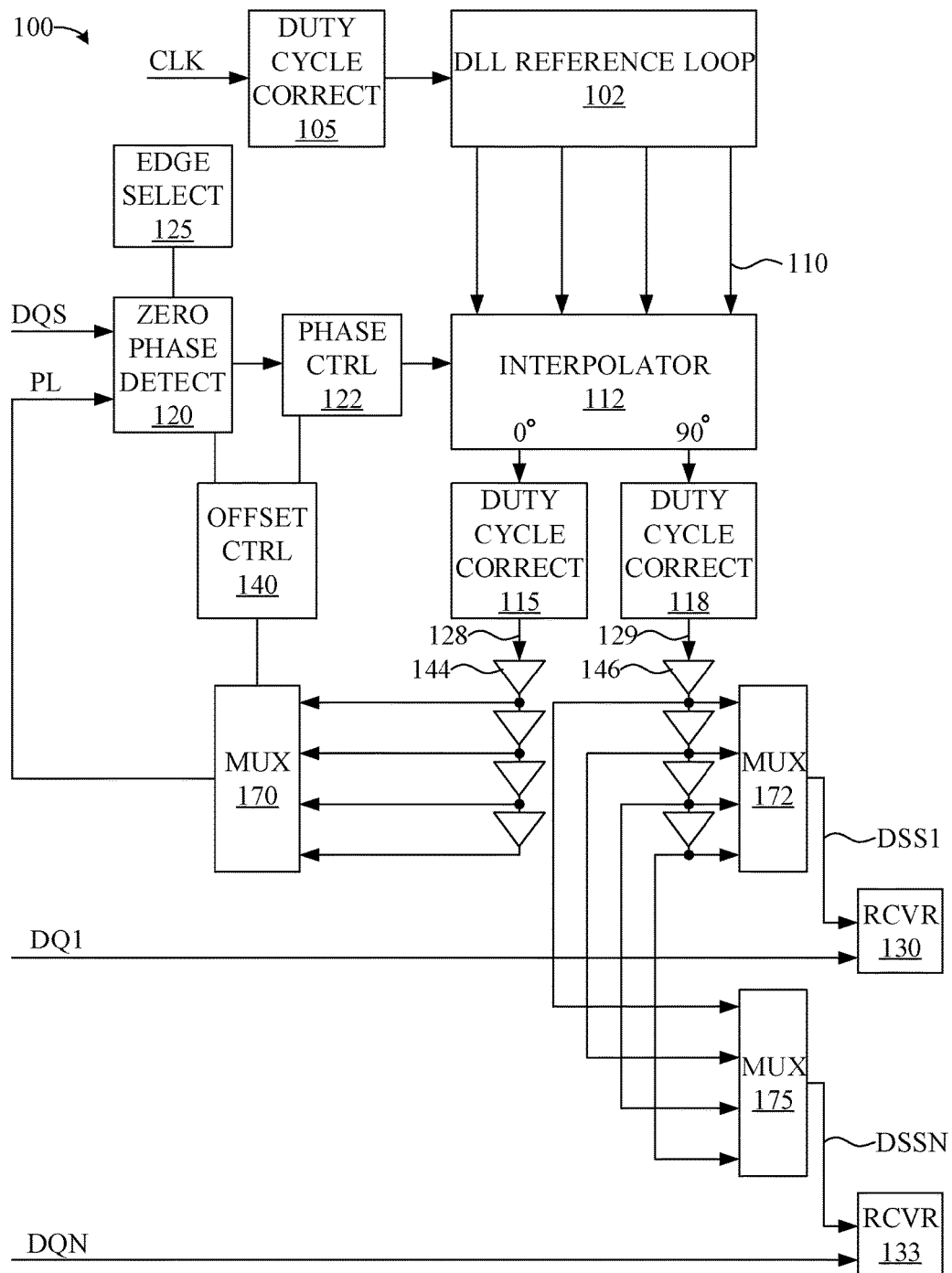
FIG. 4 is a diagram of an apparatus that samples data signals with a duty cycle corrected data-sampling signal that is generated by adjustably delaying a clock signal with a delay-locked loop that is phase-locked to a strobe signal.

FIG. 4 shows another embodiment of a data-sampling apparatus 100 that creates a data-sampling signal for sampling data signals received on lines DQ1-DQN, with the phase of the data-sampling signal derived from a strobe signal or timing reference signal received on line DQS. The system 100 uses a two-stage delay-lock loop (DLL) similar to that disclosed in U.S. Pat. No. 6,125,157, assigned to Rambus Inc. and incorporated by reference herein.

In a first stage, a DLL reference loop 102 uses a clock signal on line CLK, which is duty cycle corrected by a first duty cycle correction circuit 105, to produce a set of signals 110 that are sequentially delayed replications of the corrected clock signal, termed phase vectors. In a second stage, an adjacent pair of phase vectors 110 are selected and weighted by an interpolator 112 to output a zero-degree signal at an output labeled 0°. At an output labeled 90°, another adjacent pair of phase vectors 110 are selected and weighted by interpolator 112 to output a ninety-degree signal that is phase-adjusted according to the zero-degree signal. DLL reference loop 102 and interpolator 112 thus provide a variable delay circuit to the clock signal.

The DLL reference loop 102 includes a series of delay elements arranged in a chain, the chain receiving the clock signal and generating, from the delay elements, the phase vectors 110, each of the phase vectors 110 shifted a unit delay from an adjacent phase vector. The DLL reference loop 102 may adjust the unit delays in the delay chain using a delay adjustment signal so that the phase vectors span a predetermined phase length of the clock signal. Although four phase vectors 110 are shown in FIG. 4, more or less phase vectors can be employed, such as two, three, six, eight or twelve. The phase difference between adjacent phase vectors 110 in the embodiment of apparatus 100 is 180°/N and so, for the four signals shown, each phase vector 110 is spaced from the next by 45°.

The interpolator 112 receives the phase vectors 110 from reference loop 102 and outputs the zero-degree signal and the ninety-degree signal, based upon a phase-control signal from a phase-control circuit 122. A selection circuit in phase-control circuit 122 or interpolator 112 causes interpolator 112 to select two adjacent phase vectors 110 and create the zero-degree signal from a weighted combination of those signals 110. The zero-degree signal resulting from the mathematical combination of phase vectors 110 by interpolator 112 is designed to be in phase, after subsequent processing, with the strobe signal received on line DQS. An embodiment of selection circuitry in interpolator 112 that may be employed in the present invention is disclosed in the above-referenced U.S. Pat. No. 6,125,157.

The clock signal on line CLK is a master clock signal for an information transfer system that includes system 100 and can also be used, for example, to synchronize transmission of the strobe signal and data signals to a remote device, not shown in this figure. The strobe signal received on line DQS has substantially the same frequency in this embodiment as the clock signal received on line CLK. The ninety-degree signal results from a mathematical combination of reference signals 110 by interpolator 112 that is designed in this embodiment to be out of phase with the zero-degree signal by 90°.

The zero-degree signal is fed through a duty cycle correction circuit 115, which is configured to output a phase-lock signal PL on line 128 having a substantially 50% duty cycle regardless of imperfections in the duty cycle of the zero-degree signal. The ninety-degree signal is fed through a similar duty cycle correction circuit 118, which is configured to output a data-sampling signal on line 129 having a substantially 50% duty cycle regardless of imperfections in the duty cycle of the ninety-degree signal. An embodiment of a duty cycle correction circuit that may be employed in the present invention is disclosed in the above-referenced U.S. Pat. No. 6,125,157.

A zero phase detector 120 receives the strobe signal on line DQS and the phase-lock signal on line PL from duty cycle correction circuit 115, and compares the two signals to generate an early or late signal to the phase-control circuit 122. The phase-control circuit 122 uses the early or late signal to cause interpolator 112 to move the zero-degree signal forward or backward in time until the phase-lock signal is in phase with DQS.

Figure 5:
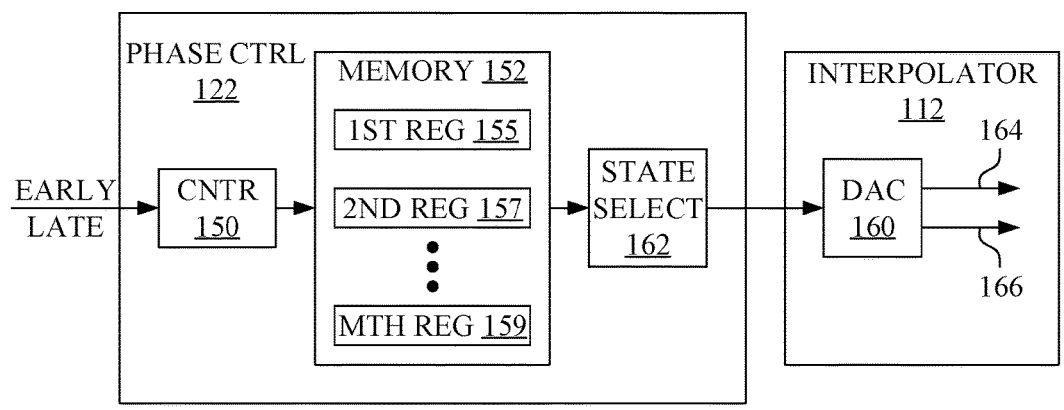
FIG. 5 is a diagram of a portion of the apparatus of FIG. 4, including elements of a phase control device and interpolator.

Phase-control circuit 122, which is shown in more detail in FIG. 5, includes a counter 150 that has a digital state determined by a history of early or late signals received from zero phase detector 120, the digital state stored in a first register 155 of a memory 152 and maintained in the absence of the input strobe signal. Alternatively, the digital state of the counter 150 may drive the interpolator 112 directly, without storage of the state in a register.

The memory 152 has M registers, including second register 157 through MTH register 159, for storing M states of phase-control circuit 122. As discussed further below, second register 157 through MTH register 159, which may alternatively be disposed outside phase-control circuit 122, store states that may be used to control the output of interpolator 112 or other interpolators, not shown in this figure, to provide additional data-sampling signals. The additional data-sampling signals may be used for transmitting strobe or timing reference signals to the remote device rather than receiving strobe or timing reference signals from the remote device, for synchronization of the received data signals with the local clock signal CLK, or for communication with different remote devices, for example.

In order to avoid instability, phase-control circuit 122 may act as a digital filter by requiring two or more consecutive early or late signals before changing the signal output to interpolator 112. The phase-control circuit 122 can also be caused to hold the signal output to interpolator 112 constant, ignoring the signal from the zero phase detector 120. This can be used, for example, to lock the phase position of the ninety-degree signal for sampling data even when strobe signal DQS is nonexistent or suspected to have errors.

Phase-control circuit 122 also communicates to a digital-to-analog converter (DAC) 160 within interpolator 112, which converts a digital state such as a six-bit word stored in the first register 155 into a pair of control signals 164 and 166 that is applied to control the weighting of the phase vectors 110 selected by the selection circuitry, interpolating between those phase vectors. This weighting of the phase vectors 110 can be achieved by controlling the current drawn by sources connected to the selected phase vectors, and integrating that current with corresponding capacitors, as described in above-referenced U.S. Pat. No. 6,125,157. For the situation in which other digital states are stored in phase-control circuit 122, a state selection circuit 162 is provided that selects whether the state stored in first register 155 or other registers 157-159 is provided to DAC 160. The state selection circuitry also selects the two adjacent phase vectors 110 that are interpolated by signals 164 and 166 from DAC 160.

The 90° output signal, after passing through duty cycle correction circuit 118, provides a data-sampling signal having a predetermined quadrature phase relationship to a data signal received on line DQ1 for sampling with a conventional receiver 130. Thus receiver 130 can sample the data signal on line DQ1 with an accurately aligned quadrature signal on line DSS1 that has a substantially 50% duty cycle, instead of direct strobing the data signal on line DQ1 with the strobe signal, which may have jitter, imperfections in duty cycle, reduced edge slopes due to dispersion during transmission, and transient errors such as intersymbol errors and crosstalk errors. The data-sampling signal may also provide a free running clock signal, as opposed to a strobe signal that may only exist concomitant with receiving data.

Additional receivers, such as Nth receiver 133, can sample other data signals on lines such as data line DQN, with the data-sampling signal produced by apparatus 100. Thus apparatus 100 can be used for data signals transmitted over a multi-bit wide bus. System 100 can employ phase information of strobe signal DQS to synchronize a virtually ideal, free running quadrature clock signal having a 50% duty cycle and sharp rising and falling edges for sampling received data signal DQ.

An offset control circuit 140 can be coupled to either the zero phase detector 120 or the phase-control circuit 122 to adjust the phase of 0° output so that the zero clock signal is slightly out of phase with strobe signal DQS. Alternatively, 90° output may be adjusted slightly by interpolator 112 to not be exactly 90° out of phase with 0° output. This may be used, for example, to better align the signal output from duty cycle correction circuit 118 with the quadrature of data signals DQ and DQX. Thus, for a common situation in which a number of data bits, such as a byte, are received in parallel by a number of receivers associated with a strobe signal, such as receiver 130 and receiver 133, offset control circuit 140 offers a per-byte adjustment of the phase of the data-sampling signal. Similar per-byte calibration of the data-sampling signals can be accomplished by multiplexer 170, which may also be controlled by offset control, and which can select how many delay elements 144, such as inverters, are in the path of the phase-lock signal.

Further adjustment of the data-sampling signal can be achieved by providing another series of delay elements 146, such as inverters, to the data-sampling signal. Multiplexer 172 is provided for selecting the number of delay elements 146 that the data-sampling signal DSS1 encounters compared to the number of delay elements 144 that phase-lock signal PL encounters. Multiplexer 175 is provided for selecting the number of delay elements 146 that the data-sampling signal DSSN encounters compared to the number of delay elements 144 that phase-lock signal encounters. This selection of delay elements 146 offers a per-bit calibration of the data-sampling signals DSS1-DSSN. In this fashion, early, normal or late data-sampling clock signals can be selectively provided to each of the various receivers sampling data signals from a byte-wide or multi-byte wide bus.

The zero phase detector 120 may be configured to compare the falling edges of the DQS and the phase-lock signals, since such falling edges are commonly produced by N-MOS drivers that drive faster transitions than P-MOS drivers that are commonly used to produce rising edges. An optional edge selector 125, which may be a part of zero phase detector 120, includes circuitry such as a configurable register that can be programmed to cause zero phase detector 120 to look at rising edges of the DQS and the phase-lock signals, instead of or in addition to comparing the falling edges of those signals.

Although a single interpolator 112 is shown in this figure, other interpolators may also receive the output signals 110 from reference loop 102. Moreover, provided that the traces that carry output signals 110 have matched lengths and impedances, interpolators such as interpolator 112 may be located a relatively long distance from reference loop 102. Thus many such interpolators may be located on the same electronic circuit, each of which uses signals 110 from reference loop 102 as phase vectors.

For example, as discussed further below, apparatus 100 may be part of a memory controller formed on an integrated circuit chip that communicates with plural DRAM devices disposed on other integrated circuit chips. In this case, another interpolator may receive output signals 110 for controlling transmission of data and strobe or timing reference signals to those DRAM devices. For the situation, also described in further detail below, in which plural devices such as DRAMs share transmission lines such as a memory bus, a separate interpolator may be provided on the memory controller for communicating with each of the DRAM devices, with each interpolator controlled by a signal specific to the corresponding DRAM device.

Figure 6:
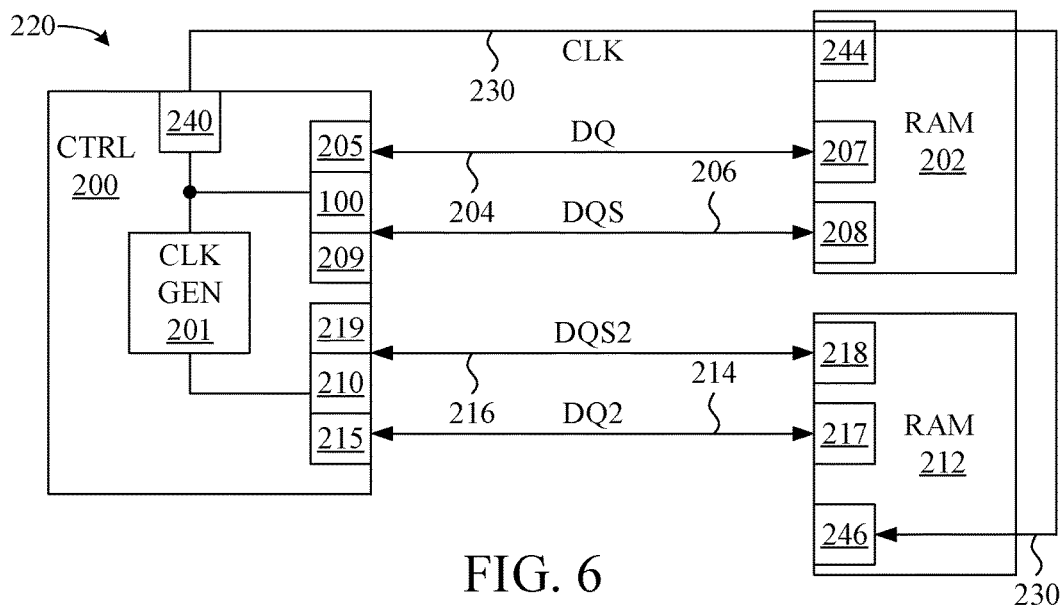
FIG. 6 is a diagram of a system for communicating data including a controller and a plurality of memory devices.

FIG. 6 shows the timing system 100 employed as part of a memory controller 200 that communicates with memory devices RAM 202 and RAM 212 to read and write data for a memory system 220. Data signals DQ are sent on a bus 204 having multiple parallel conductive traces between a first group of input/output (I/O) units 205 and a second group of I/O units 207. Each of the I/O units 205 and 207 have a conventional data transmit circuit and a conventional data receive circuit corresponding to each of the traces. Strobe signals DQS can be communicated between system 100 and an I/O unit 208 of RAM 202 over trace 206. That is, strobe signals DQS are received by system 100 as discussed above, and can be sent by a conventional strobe transmit circuit or transmitter 209 that is coupled to system 100.

Memory controller 200 also contains another timing system 210 that is similar to system 100. Timing system 210 receives strobe signals DQS2 from I/O unit 218 via trace 216. A second strobe transmitter 219 is coupled to timing system 210 for sending strobe signals DQS2 from controller 200 to I/O unit 218. A group of I/O units 215 communicates data signals DQ2 with I/O units 217 of RAM 212 over bus 214. Since the I/O units 207 of RAM 202 and I/O units 217 of RAM 212 are the only I/O units directly connected to respective I/O units 205 and 215 of controller 200, strobe signals DQS and DQS2 are sent according to point-to-point communication.

Clock, command and address signals are sent from controller 200 to memory devices RAM 202 and RAM 212 along control line 230. Alternatively, clock signals may be generated by an external clock chip. Control line 230 is coupled to receivers 244 and 246 in a multi-drop configuration, although a point-to-point configuration is also possible. Associated data and strobe traces 204 and 206 are designed to be closely matched with each other, and associated data and strobe traces 214 and 216 are also designed to be closely matched with each other, however, control line 230 may have a substantially different path length and delay than any of the traces.

Conventional clock transmitter 240 sends a clock signal CLK to respective clock receivers 244 and 246. The data signals DQ and DQ2 and strobe signals DQS and DQS2 that are sent by memory devices RAM 202 and 212 to memory controller 200 are transmitted according to the clock signals CLK received by those memory devices. Similarly, the data signals DQ and DQ2 and strobe signals DQS and DQS2 that are sent by memory controller 200 to memory devices RAM 202 and 212 are, after being received, written to memory addresses according to the clock signals CLK received by those memory devices.

Although FIG. 6 depicts timing systems 100 and 210 implemented in the context of a memory system 220, note that such timing systems can be employed in a variety of other applications, including digital, analog, chip-to-chip, logic-to-logic, peripheral device communications, network communications or any other system where signals are transmitted between a transmitter and a receiver. Also note that timing systems such as systems 100 and 210 may be included in memory devices RAM 202 and RAM 212, instead of or in addition to being included in controller 200, and may be provided in one or more communicating devices of the applications and systems listed above.

Controller 200 and memory devices RAM 202 and RAM 212 may be formed within the same integrated circuit, in a system-on-chip embodiment. Alternatively, controller 200 and memory devices RAM 202 and RAM 212 may each be formed as a separate integrated circuit, which may be connected by printed circuit board (PCB) traces on a single PCB as a multi-chip package or separate PCBs coupled to a motherboard. In another embodiment, controller 200 and memory devices RAM 202 and RAM 212, or other communication devices, may be interconnected by transmission lines such as network channels.

For the situation in which a phase providing signal such as strobe signal DQS is intermittent, additional mechanisms can be employed to improve the data-sampling signal. As mentioned above, phase-control circuit 122 can be set to hold its state during time periods in which the strobe signal is not received. In addition, phase state maintenance operations can be conducted which convey process, voltage or temperature induced phase differences to the phase-control circuit 122 in the absence of data requests. Such maintenance operations may involve at least a minimal number of strobe signal reads from a device such as memory device RAM 202, in which a strobe signal is sent to system 100 to acquire phase information.

Various types of maintenance operations can be used to acquire phase information, including the following examples. A power-up type of maintenance operation may occur shortly after power is initially provided to devices such as controller 200 and/or memory devices RAM 202 and RAM 212. A power state change type of maintenance operation may occur during run-time power state transitions of the devices. For instance, such a power state change maintenance operation can occur during transitions into and out of low power sleep, nap, standby or other power saving modes. A periodic type of maintenance operation may be triggered by a clock, counter or interrupt mechanism whereby either a fixed or programmable minimum time duration is specified that causes the maintenance operation to be run. For the implementation of timing system 100 in a memory system, a hidden-refresh type of maintenance operation may be performed in parallel with a DRAM refresh operation.

Maintenance operations may not be needed for systems communicating intermittent strobe signals that have a minimal number of pre-amble or post-amble strobe cycles for acquiring phase information by phase-control circuit 122. Also, depending upon the number of strobe cycles accompanying a data signal read, an intermittent strobe signal may provide sufficient phase information for timing system 100, especially if the data signal is read after a delay.

The phase information gleaned from a strobe signal DQS received by memory controller 200 from RAM 202 can also be used to synchronize transmission of data signals DQ from memory controller 200 to RAM 202, so that the data signal DQ received by RAM 202 is aligned with the clock signal CLK at that RAM 202. That is, the digital state of the phase-control circuit 122 controls phase-adjustment of the reference clock signal CLK relative to received strobe signal DQS, and thus provides an indication of transmission differences between bus 204 and control line 230. The digital state for received signals can be used to create a digital state for transmit signals that compensates for those transmission differences in writing data.

The transmit state of the phase-control circuit 122 may be the complement of the received state of that circuit, causing the interpolator to output a transmit strobe signal that is phase-shifted from CLK an opposite amount as the phase difference between the received strobe signal DQS and reference clock CLK. Since the state of phase-control circuit 122 is a digital number, reversing the phase-adjustment to transmit DQS instead of receive DQS may simply involve subtracting the received state from unity to obtain the transmit state, which is output to the interpolator. The interpolator may also output a transmit data signal DQ that is 90° out of phase with the transmit strobe signal DQS, which can be accomplished via another simple transformation of the transmit state settings, to provide data and strobe signals having a quadrature relationship to memory device RAM 202. Also note that because the transmit data signal DQ can, by this mechanism, be aligned with the clock signal CLK at a remote device such as RAM 202, transmission of a strobe signal for sampling that data signal DQ at the remote device may not be necessary.

For example, if the phase-control circuit 122 has a state acquired from DQS signals received from I/O unit 208 that causes interpolator 112 to output a 0° signal that is advanced by ten degrees relative to clock signal CLK, then a DQS signal transmitted from transmitter 209 to I/O unit 208 can be delayed by ten degrees relative to clock signal CLK, in addition to an optional quadrature offset. Various states of phase-control circuit 122 may be stored by controller 200 and applied as desired to control interpolator to output data-sampling signals as needed.

Note that while the phase of a transmitted data or strobe signal can be derived from the phase of a received data or strobe signal, as described above, it is also possible to have the transmit phase determined irrespective of the received phase, for example by programming a register with a phase control state. In this case, separate transmit phase vectors can be used to generate the transmitted data or strobe signal or the same phase vectors used for generating received data-sampling signals can be used to generate transmitted data or strobe signals.

Figure 7:
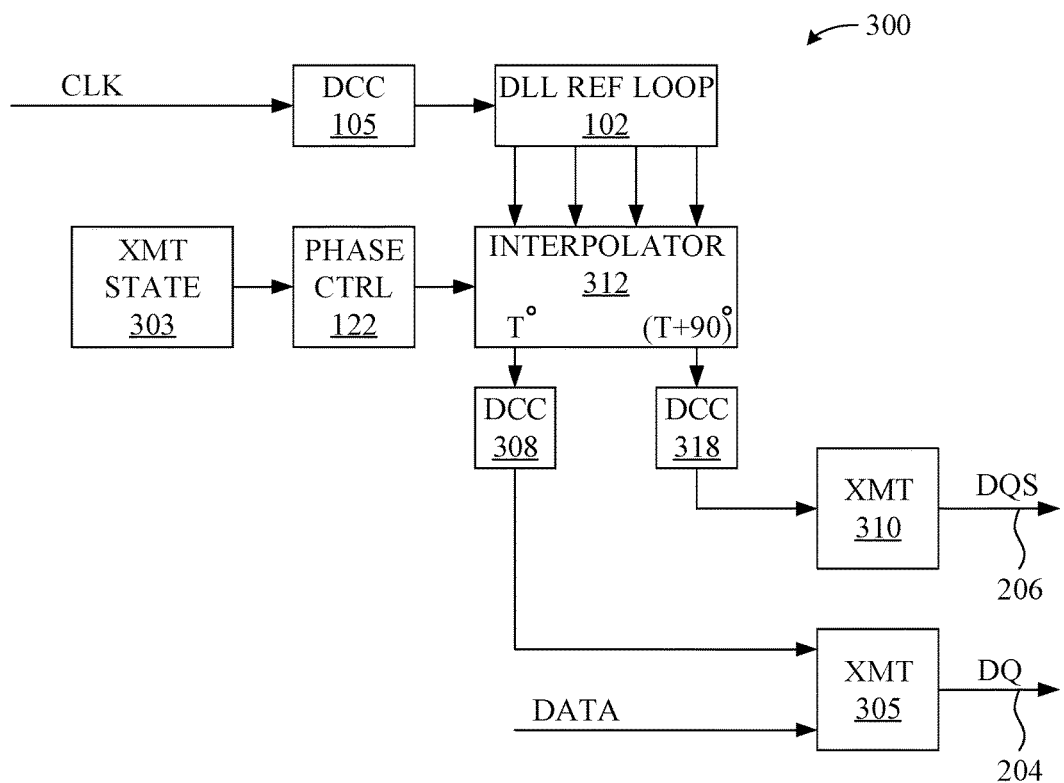
FIG. 7 is a diagram of a system for transmitting data using a transmit state derived from a received state of the apparatus of FIG. 4.

FIG. 7 illustrates a system 300 for transmitting data using a transmit state 303 derived from a received state of the phase-control circuit 122. Although the DLL interpolator 112 described above in the context of receiving data may also be employed for transmitting data, the embodiment illustrated in FIG. 7 includes an additional and substantially similar DLL interpolator 312 to that described above. Interpolator 312 outputs a transmit data signal T° and a transmit strobe signal (T+90°) that is offset from the transmit data signal T° by approximately ninety degrees, in accordance with the transmit state 303.

The data to be transmitted is provided to a conventional data transmitter 305 along with the transmit data signal T° that has been duty cycle corrected by duty cycle correction circuit 308. Data transmitter 305 transmits data signal DQ along bus 204, the data signal DQ having a predetermined phase relationship with the clock signal CLK so that the data arrives at RAM 202 at a desired phase relationship to the clock signal CLK at RAM 202. Other transmitters, not shown, may also transmit other data signals on bus 204 using transmit data signal T°. At the same time, after passing through duty cycle correction circuit 318, a quadrature transmit clock signal may be provided to conventional data strobe transmitter 310, which transmits strobe signal DQS on bus 206 so that strobe signal DQS has a predetermined phase relationship with the clock signal CLK upon arrival at RAM 202.

Figure 8:
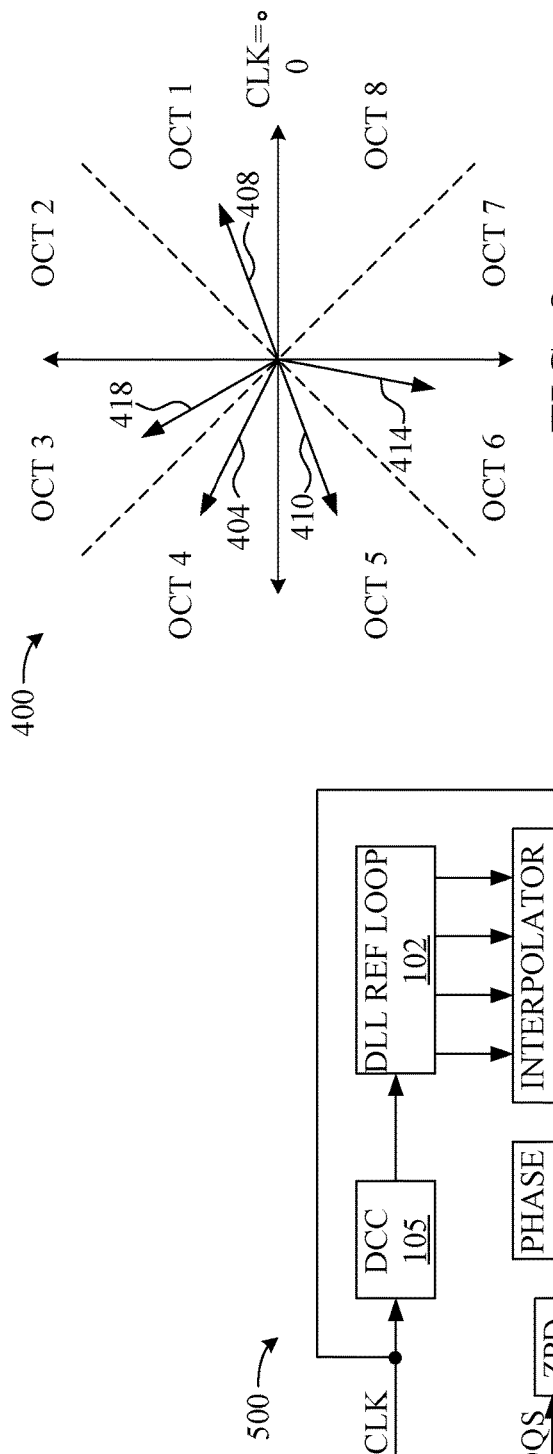
FIG. 8 is a phase diagram of the data-sampling signal relative to a master clock domain.
Figure 9:
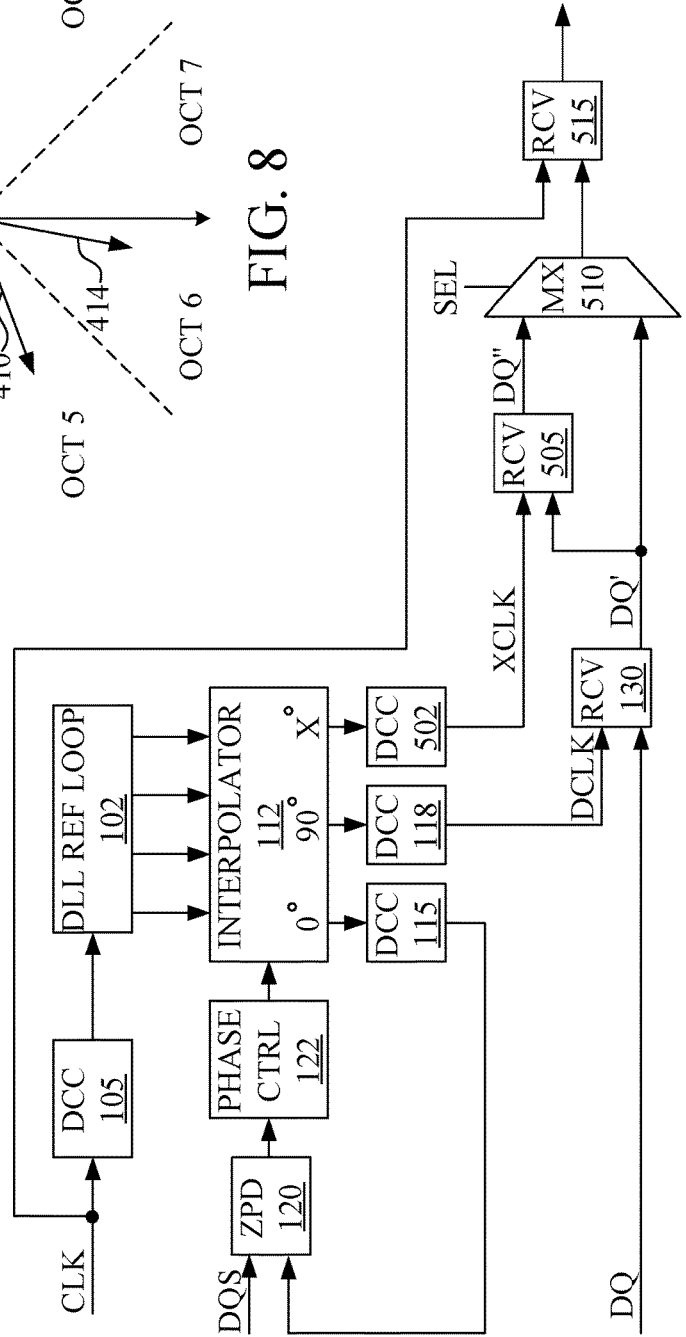
FIG. 9 is a diagram of a mechanism that can be used for data sampled by the data-sampling signal and read with the master clock signal.

Another use of the phase information acquired by system 100 and quantified as a received state of phase-control circuit 122 is shown in FIG. 8 and FIG. 9. As described above, for example with reference to FIG. 4, data signals DQ received by system 100 and receiver 130 are sampled by a quadrature signal that is phase spaced relative to the received strobe signal DQS, and so received data may be said to be in a data-sampling clock domain DCLK. Controller 200, however, manipulates data, control signals and logic according to master clock signals CLK, and may be said to be in a master clock domain. Controller 200 may be an application specific integrated circuit (ASIC), so logic and data manipulation by the controller may be said to be in the ASIC domain. Because the received state of phase-control circuit 122 includes information relating DQS and CLK signals, the received state can be used to transfer received data from the DQS domain to the master clock or ASIC domain with minimal latency and adequate setup and hold time, thus avoiding any meta-stability risks.

FIG. 8 is a phase diagram 400 of the phase of the data-sampling clock DCLK in the master clock domain, i.e., with master clock CLK phase defined as 0°. The phase diagram is divided into eight octants, labeled OCT 1 through OCT 8, which can be used to illustrate a general phase relationship of data-sampling clock DCLK relative to the master clock CLK signal. Note that the receive state of phase-control circuit 122 controls an interpolation between reference vectors of reference loop 102 that defines in which octant the phase of DCLK signal is found relative to CLK.

FIG. 9 shows a mechanism 500 that can be used for data that may be sampled by data-sampling signal DCLK as described above, in order to read that data by CLK. Interpolator 112 in this embodiment includes an auxiliary output signal labeled X°, which outputs to a duty cycle correction circuit 502 that in turn outputs an auxiliary clock signal XCLK to an auxiliary receiver 505. Receiver 505 also receives data signal DQ' that is output by receiver 130 to multiplexer 510, and receiver 505 outputs data signal DQ" to multiplexer 510. Multiplexer 510 outputs either DQ' or DQ" to receiver 515, which uses clock signal CLK to read the data in the master clock domain.

In order to read the data with CLK, DCLK should be in the left-hand side of phase diagram 400 to avoid potential setup and hold time conflicts between CLK and DCLK. If the state of phase-control circuit 122 indicates that DCLK is in OCT 4 or OCT 5 for example, as shown by arrow 404, the multiplexer 510 may be set to select DQ', which is then clocked with CLK by receiver 515. If, however, the state of phase-control circuit 122 indicates that DCLK is in the right hand side of phase diagram 400, as shown by arrow 408, phase-control circuit 122 can cause auxiliary output X° to output the inverse of DCLK, shown by arrow 410. Receiver 505 then reads data DQ' with XCLK and outputs DQ" in phase with XCLK. Phase-control circuit 122 also in this case signals to multiplexer 510 to select DQ", which is then clocked with CLK by receiver 515. Since the phase of DQS relative to CLK is represented as a digital state of phase-control circuit 122, inverting the phase output by interpolator 112 involves a simple manipulation of that state.

If the state of phase-control circuit 122 instead indicates that DCLK is in OCT 6, as shown by arrow 414, phase-control circuit 122 can cause auxiliary output X° to output XCLK having one-half the phase shift from CLK as that of DCLK, as shown by arrow 418. Changing the phase state to output a signal having one-half the phase shift from CLK is also an easy operation. In this case also phase-control circuit 122 signals to multiplexer 510 to select DQ", which is then clocked with CLK by receiver 515. Thus, working with the phase octant of the data-sampling clock DCLK relative to the master clock CLK, system 500 can transfer data between the data strobe domain DQS and the master clock CLK domain with minimal latency. Although described in terms of phase octants, other divisions of phase diagram 400 may be employed, as well as more or less frequency reference vectors.

The data-timing systems described above can also be used to receive and transmit data for the situation in which a strobe signal DQS has a different frequency than a master clock signal CLK. For example, the clock frequency CLK may be an integer multiple of the data strobe DQS frequency, for receiving or transmitting the data with one rather than both clock CLK edges. In this case, duty cycle correction of the CLK signals may not be needed, but phase information of the received data strobe DQS is used to generate a data-sampling clock DCLK. The double-frequency DCLK signal may be 180° out of phase with a 0° output that is in phase with DQS, to read the received data signal DQ with one edge of DCLK that is approximately 90° out of phase with DQ.

Figure 10:
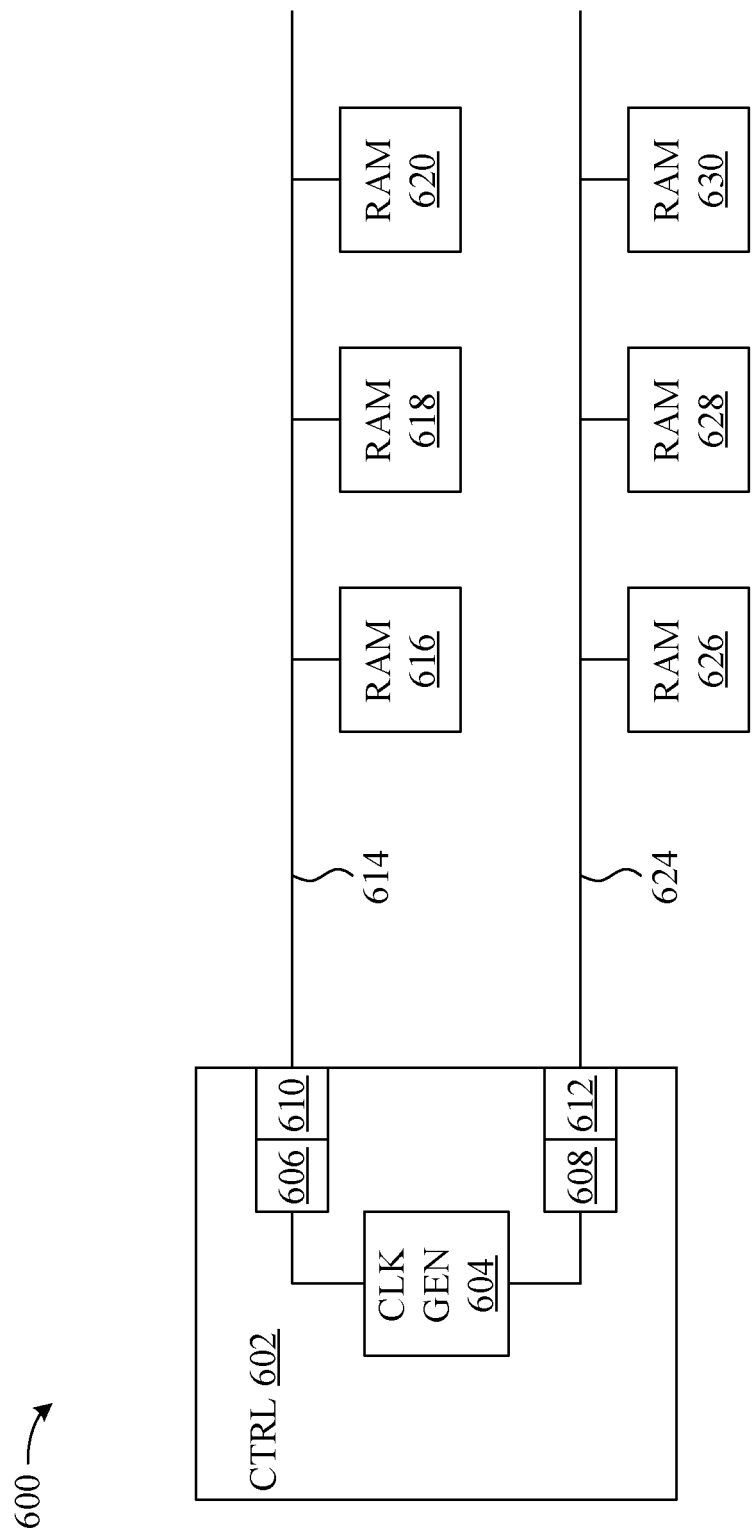
FIG. 10 is a diagram of an implementation of the present invention in an information storage and transfer system having a multi-drop bus with plural devices coupled to the bus.

While the above-described mechanisms and methods are useful for point-to-point data transfer between two devices of a system that transfers information, in systems such as a memory system the number of pins available at the controller limit additional DRAM connections to controller 200. FIG. 10 illustrates an implementation of the present invention in an information storage and transfer system 600 having a multi-drop bus that allows more than one memory device to be coupled to the bus. A controller 602 includes a conventional master clock generator 604 and a plurality of data-timing systems 606 and 608. An I/O unit or group of I/O units 610 are coupled to data-timing system 606 and another I/O unit or group of I/O units 612 are coupled to data-timing system 608. A first bus 614 couples memory devices 616, 618 and 620 to controller 602 via I/O group 610. A second bus 624 couples memory devices 626, 628 and 630 to controller 602 via I/O group 612. Buses 614 and 624 may each include data, strobe, clock and control channels. Data, strobe and control signals may be routed to controller 602 and the memory devices based upon their addresses within system 600.

Data-timing system 606 and 608 may be similar to timing systems 100 and 500 described above. In this multi-drop system 600, however, data-timing systems 606 and 608 each store different phase-control states specific to each of the coupled memory devices. That is, data-timing system 606 acquires phase information from a strobe signal sent by memory device 616, the phase information quantified as a digital state of a phase-control circuit of system 606 and used to create a data-sampling signal for clocking data received from that memory device 616. Similarly, data-timing system 606 separately acquires phase information from a strobe signal sent by memory device 618, and also separately acquires phase information from a strobe signal sent by memory device 620, the phase information stored as digital states of a phase-control circuit of system 606. Controller 602 not only stores the plural received phase-control states of data-timing system 606 but also stores plural received phase-control states of data-timing system 608.

In addition, controller 602 may store various other phase-control states of data-timing systems 606 and 608, such as individual transmit timing states for transmitting data to each of the memory devices, and individual auxiliary states for transferring received data into the clock domain of master clock generator 604. Each of these states may include information regarding per-byte offsets as well as per-bit offsets, as described above with reference to FIG. 4. Thus controller 602 may select for a particular communication (e.g., data read or data write) with a particular device (e.g., RAM 616, RAM 618 or RAM 620), a digital state corresponding to the device and to the communication, the selected state being employed to provide phase adjustment on a per-bit as well as per-byte basis, the phase adjustment used for sampling received data, transmitting data in a phase for sampling, or aligning data with a selected clock domain.

Although described above as a master-slave system, multi-drop system 600 can be implemented as a system having plural controllers, each of which has a data-timing system similar to that described above. Moreover, the strobe signals need not be sent by the same device that transmits data signals. For example, another clock may be provided on an opposite end of bus 614 that transmits clock-to-master signals that are used by memory devices 616, 618 and 620 in transmitting data to controller 602, with those clock-to-master signals processed by data-timing system 606 to receive the data. In this case, a duty cycle corrected master clock can be phase-adjusted by the received clock-to-master signals to create a data-sampling signal for receiving the data and shifting the received data to the master clock domain.

Although we have focused on teaching the preferred embodiments of improved data-timing systems, other embodiments and modifications of this invention will be apparent to persons of ordinary skill in the art in view of these teachings. Therefore, this invention is limited only by the following claims, which include all such embodiments, modifications and equivalents when viewed in conjunction with the above specification and accompanying drawings.

What is claimed is:

1. An integrated-circuit device comprising:
    a data transmitter having a data input to receive a data input signal, a timing input to receive a timing signal, and a data output to transmit a data output signal timed to the timing signal;
    a strobe transmitter to transmit a transmit-strobe signal synchronized with the timing signal; and
    a phase-control circuit to control a phase of the timing signal and the transmit-strobe signal, the phase-control circuit including:
        memory to store at least one transmit state setting the phase of the timing signal and the transmit-strobe signal.

2. The integrated-circuit device of claim 1, further comprising a phase detector to detect a phase of a receive-timing signal.

3. The integrated-circuit device of claim 2, the phase-control circuit to derive a receive state from the detected phase of the receive-timing signal.

4. The integrated-circuit device of claim 3, the phase-control circuit to store the receive state absent the receive-timing signal.

5. The integrated-circuit device of claim 3, the phase-control circuit to derive the transmit state from the receive state.

6. The integrated-circuit device of claim 5, wherein deriving the transmit state from the receive state comprises subtracting the receive state from unity.

7. The integrated-circuit device of claim 2, wherein the receive-timing signal is a data strobe.

8. The integrated-circuit device of claim 1, wherein the receive-timing signal transitions irregularly between relatively high and low voltage levels.

9. The integrated-circuit device of claim 1, further comprising a first integrated circuit to receive the data output signal and the transmit-strobe signal, the at least one transmit state comprising a first transmit state to time the data output signal to the first integrated circuit.

10. The integrated-circuit device of claim 9, further comprising a second integrated circuit, the at least one transmit state comprising a second transmit state to time second output data transmitted to the second integrated circuit.

11. A method of communicating a transmit data signal with a timing-reference signal timed to the transmit data signal, the method comprising:
    deriving a receive state from a timing-reference signal accompanying a received data signal;
    deriving a transmit state from the receive state;
    storing at least one of the receive state and the transmit state;
    phase adjusting a transmit data signal responsive to the transmit state; and
    storing the transmit state absent the transmit data signal.

12. The method of claim 11, further comprising phase adjusting a second timing-reference signal responsive to the transmit state and transmitting the second timing-reference signal with the transmit data signal.

13. The method of claim 12, further comprising phase adjusting the second timing-reference signal ninety degrees out of phase with respect to the transmit data signal.

14. The method of claim 11, wherein deriving the transmit state from the receive state comprises subtracting the receive state from unity.

15. The method of claim 11, wherein the timing-reference signal is a data strobe.

16. The method of claim 11, wherein the timing-reference signal transitions irregularly between relatively high and low voltage levels.

17. The method of claim 11, further comprising:
    deriving a second receive state from a second timing-reference signal accompanying a second received data signal;
    deriving a second transmit state from the second receive state;
    storing at least one of the second receive state and the second transmit state absent the second received data signal; and
    phase adjusting a second transmit data signal responsive to the second transmit state.

18. An integrated circuit device comprising:
    a data transmitter having a data input to receive a data input signal, a timing input to receive a timing signal, and a data output to transmit a data output signal timed to the timing signal;
    means for deriving a receive state from a timing-reference signal accompanying a received data signal;
    memory for storing the receive state absent the received data signal;
    means for deriving a transmit state from the receive state; and
    means for phase adjusting a transmit data signal responsive to the transmit state.

19. The integrated circuit device of claim 18, further comprising means for storing the transmit state.

* * * * *